(12) United States Patent
Dietz et al.

(10) Patent No.: US 9,194,926 B2
(45) Date of Patent: Nov. 24, 2015

(54) METHOD FOR OPERATING A COIL AND A MONITORING MODULE

(71) Applicants: Peter Dietz, Fürth (DE); Georg Pirkl, Dormitz (DE); Thorsten Speckner, Erlangen (DE)

(72) Inventors: Peter Dietz, Fürth (DE); Georg Pirkl, Dormitz (DE); Thorsten Speckner, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 460 days.

(21) Appl. No.: 13/769,315

(22) Filed: Feb. 16, 2013

(65) Prior Publication Data

US 2013/0214784 A1    Aug. 22, 2013

(30) Foreign Application Priority Data

Feb. 16, 2012 (DE) .......................... 10 2012 202 416

(51) Int. Cl.
*G01R 33/54* (2006.01)
*G01R 33/385* (2006.01)

(52) U.S. Cl.
CPC ............ *G01R 33/54* (2013.01); *G01R 33/3854* (2013.01)

(58) Field of Classification Search
CPC ..... G01R 33/3854; G01R 33/28; G01R 33/54
USPC .................................. 324/307, 314, 318, 320
See application file for complete search history.

(56) References Cited

U.S. PATENT DOCUMENTS

| 6,407,548 | B1 | 6/2002 | Dietz | |
| 2005/0270030 | A1 | 12/2005 | Takai | |
| 2009/0209842 | A1* | 8/2009 | Koevoets et al. | 600/410 |
| 2010/0253334 | A1* | 10/2010 | Van Der Koijk et al. | 324/307 |
| 2013/0162249 | A1* | 6/2013 | Dietz et al. | 324/307 |

FOREIGN PATENT DOCUMENTS

| DE | 19903627 A1 | 8/2000 |
| WO | WO 98/13703 | 4/1998 |

OTHER PUBLICATIONS

German Office Action dated Oct. 12, 2012 for corresponding German Patent Application No. DE 10 2012 202 416.6 with English translation.

* cited by examiner

*Primary Examiner* — Melissa Koval
*Assistant Examiner* — Rishi Patel
(74) *Attorney, Agent, or Firm* — Lempia Summerfield Katz LLC

(57) ABSTRACT

A method for operating a coil, through which a varying current flows, is provided. Mechanical resonance responses of the coil are recorded and are modeled by an electrical resonant circuit model. A check is made as to whether a varying current that is to be sent through the coil evokes a resonant response in the electrical resonant circuit model. The current flow through the coil is blocked if the resonant response exceeds a predefined limit value.

20 Claims, 3 Drawing Sheets

METHOD FOR OPERATING A COIL AND A MONITORING MODULE

This application claims the benefit of DE 10 2012 202 416.6, filed on Feb. 16, 2012, which is hereby incorporated by reference.

BACKGROUND

The present embodiments relate to a method for operating a coil, through which a varying current flows.

An electric current always produces a magnetic field. In an electric coil, this magnetic field is especially marked. If another external magnetic field is present, an interaction results, and an attraction or repulsion of the coil results. This physical effect is well known and is consciously exploited in many applications. Coils are also used in various forms and with various functions in a magnetic resonance tomography system.

Magnetic resonance tomography (e.g., nuclear spin tomography) is a technique that has become widespread for the acquisition of images of the interiors of the bodies of living objects under investigation. In order to obtain an image using this method (e.g., a magnetic resonance record of an object under investigation), the body of the patient or the part of the body under investigation is exposed to a static basic magnetic field (e.g., the $B_0$ field) that is as homogeneous as possible. The static basic magnetic field is produced by a basic field magnet in the magnetic resonance measurement device. Overlaid on this basic magnetic field during the recording of the magnetic resonance images are rapidly switched gradient fields that are produced by gradient coils. Apart from these, HF pulses with a defined field strength are radiated into the investigation space, in which the object under investigation is located, using a high-frequency antenna. The magnetic flux density of these HF pulses may be designated $B_1$. The pulsed high-frequency field may thus also be designated the $B_1$ field for short. Using these HF pulses, the nuclear spins of the atoms in the object under investigation are excited such that the nuclear spins are turned from an equilibrium orientation that lies parallel to the basic magnetic field $B_0$, by an "excitation flip angle" (in what follows, also referred to as the "flip angle" for short). The nuclear spin precesses about the direction of the basic magnetic field $B_0$. The magnetic resonance signals thereby produced are picked up by high-frequency receiving antennas. The receiving antennas may either be the same antennas as those, with which the high-frequency pulses are also emitted, or may be separate receiving antennas. The magnetic resonance images are generated on the basis of the magnetic resonance signals received.

The gradient coils have high currents (e.g., in the region of a few hundred Amperes) flowing through. The gradient coils are located in the strong basic magnetic field, in the immediate neighborhood of the basic field magnets. The interaction between the magnetic field from the gradient coils and the basic magnetic field is thus strong, and the mechanical effects on the gradient coils are known. Displacements of the gradient coils lead to known loud noises during magnetic resonance tomography. While these noises are perceived as disturbing, the noises are, however, neither damaging for the tomography system nor for the patient. The matter looks different when rapid gradient pulse sequences trigger mechanical resonance in the gradient coils or the gradient coil system, as applicable. Here, the noise is so loud that the noise is no longer acceptable for the patient. In addition, the mechanical vibrations have an effect on the gradient coil supply cables and on the gradient coil connections. As a result, for example, the screw connections on the gradient coils may become high resistance and, during longer periods of operation, heat up. Frictional heat may also result in warming. In an extreme case, the warming may become so intense that the warming leads to damage to the device.

Strong mechanical vibrations, such as arise in the case of a resonance, may also lead to a breakage in the coils or in the supply cables or in the devices for fixing the gradient coils.

The problem of mechanical resonance in the gradient coils arises, for example, in the case of very rapid magnetic resonance tomography imaging technology (e.g., with echo planar imaging (EPI)). Echo planar imaging is a one-shot method. In other words, for the measurement of one complete layer, an EPI sequence uses only one single excitation pulse. The switching of the gradient coils is bipolar in order to generate a plurality of gradient echoes with alternating sign. Apart from the mechanical effects of a resonant vibration of the gradient coil system, already described, in the case of echo planar imaging resonance, the resonance may also lead to artifacts in the image in the form of EPI ghosting (e.g., ghost image formation).

Mechanical resonance in the gradient coils also has an effect on the basic magnets. In a magnetic resonance tomography system, the basic magnet may be in the form of superconducting coils. The super-conductivity is maintained by helium cooling. Resonance may cause warming, resulting in an increased rate of helium evaporation. In the extreme situation, the increased rate of evaporation may lead to magnetic quenching if the helium supply falls below the critical quantity. This provides that the superconductivity collapses, and the basic magnetic field is no longer maintained.

Resonance in a mechanical system, such as that represented by the gradient coils of a magnetic resonance tomography system, may arise at one or more resonant frequencies. The resonant frequency (frequencies) may be determined by measurement techniques or by a simulation.

The mechanical displacement of a coil, through which an electric current is flowing, is proportional to the current. Hence, a mechanical resonance with a resonant frequency f is evoked by an alternating current with a frequency f, provided that the magnitude of the current is sufficient to excite the mechanical vibrations by a magnetic field.

A first approach to avoid mechanical resonances in a coil provides that certain frequency bands that lie at the frequency of mechanical resonance or around the frequency of mechanical resonance are excluded or forbidden for the current flowing through. In magnetic resonance tomography systems, forbidden frequency bands of this type may be filed in the gradient pulse software. The software then prevents the possibility of executing gradient pulse sequences that contain frequencies within the forbidden frequency bands.

A disadvantage of this approach is that the approach makes all sequences that contain frequencies within the forbidden frequency bands unexecutable. The amplitude of the resonance excitation is not taken into account. This provides that some sequences, for which the resonance excitation amplitude lies below the critical value, become unexecutable (e.g., would not trigger any mechanical resonance).

In order to be able to generate optimal images using magnetic resonance tomography, clinicians themselves develop pulse sequences that are adapted to a specific investigation situation or a specific patient. The filing of forbidden frequency bands restricts the imaging options unnecessarily. If the user circumvents the frequency band bans, for example, because the amplitude has incorrectly been estimated to be adequately low, this may still lead to resonance excitation and, as a consequence, to damage to the gradient coil system.

SUMMARY AND DESCRIPTION

The present embodiments may obviate one or more of the drawbacks or limitations in the related art. For example, a method and a monitoring module, by which mechanical resonance vibrations of coils are avoided, are provided.

With the method for operating a coil, through which a varying current flows, a mechanical resonance response of the coil is first determined. Data about the mechanical resonance response may already be available in the form of resonance graphs, in which case the determination solely includes reading off the resonance values. Alternatively, immurements may be made on the mechanical resonance system represented by the coil or coil system, as applicable. For this purpose, the coil is excited, for example, with varying frequencies, and the deflections in each case are measured. The amplitudes of the vibrations may be measured using a vibration recorder. In one embodiment, a noise graph may be measured. In the case of a gradient coil system in a magnetic resonance tomography system, the helium evaporation rate that again provides information about the mechanical resonance response may be measured.

Alternatively, the mechanical resonance response may be determined using a simulation.

In one embodiment, the mechanical resonance response is modeled by an electrical resonant circuit model. A person skilled in the art is familiar with the use of electrical components to construct a resonant circuit that has certain oscillatory characteristics (e.g., a certain point of resonance). For example, a point of resonance may be modeled using a simple resistance-inductance-capacitance (RLC) resonant circuit.

If the coil has several resonant frequencies or several points of resonance, then it is advantageous to model each individual point of resonance by a separate electrical resonant circuit model. The entire mechanical resonance response recorded for the coil is then modeled by a combination of the individually created electrical resonant circuit models.

In a further act, a check is made as to whether a varying current that is to be sent through the coil evokes a resonant response in the electrical resonant circuit model. The creation of an electrical resonant circuit model makes it directly possible to check a planned current sequence (e.g., in the case of gradient coils, a gradient pulse sequence) as to whether it triggers a mechanical resonance in the coil. The comparison is not that of individual frequencies from the frequency spectrum of the current against a resonance graph for the coil, but the entire current signal with all the frequencies the entire current signal contains is sent through the electrical resonant circuit model. As a result, the amplitude of each of the individual frequency components is automatically taken into consideration. This also takes into consideration any possible overlaying of individual discrete frequencies that lie somewhat to one side of the resonant frequency, but which together, because of the magnitude of the amplitude, trigger a resonant vibration.

In a further act, a current flow through the coil is blocked if the resonant response exceeds a predefined limit value. If the check, using the specific varying current that is to be transmitted, gives a resonant response in the electrical resonant circuit model, that does not necessarily provide that this resonant response may actually lead to damage or has some probability of leading to damage. For example, the current flow is to only actually be prevented above a certain amplitude of vibration. The predefined limit value may be permanently specified for a coil. However, application situations, in which the limit value may be adapted to external conditions, may be provided.

A corresponding monitoring module may incorporate an electrical resonant circuit model that models a mechanical resonance response of a coil, through which a varying current flows.

The monitoring module has an input for receiving an actual value or a set value for the varying current. This input is connected to the electrical resonant circuit model, and permits the current that is to be checked to be fed into the electrical resonant circuit model. In a magnetic resonance tomography system, a gradient pulse sequence is initially output as a digital set value by the gradient coil controller. In a digital-to-analog converter, this set value is converted into an analog current and is amplified in an amplifier up to the required current strength before the analog current is fed on to the gradient coil system. In one embodiment, the electrical resonant circuit model may be fed with the set value of the varying current (e.g., in the case of a magnetic resonance tomography system with the digital value output by the gradient coil controller), or alternatively to check the actual value. In one embodiment, the actual value will not deviate from the set value. Inaccuracies in the digital-to-analog conversion and the frequency characteristics of the amplifier may lead to deviations. If the electrical resonant circuit model is digital in form, then if the actual value of the current is used, a further analog-to-digital conversion is to be effected.

The monitoring module includes, in addition, an output, for outputting a stop signal that blocks the feeding of the current into the coil. The stop signal output at this output may be a simple 1-0 signal (e.g., a binary signal that expresses a blocking or acceptance of the current that is to be fed in).

The stop signal is output if the current in the electrical resonant circuit model evokes a resonant response that exceeds a predefined limit value. By an arrangement of the monitoring module, for example, between the gradient coil controller and the gradient coil, a gradient pulse sequence may be stopped immediately before the gradient pulse evokes, in the gradient coil, an unwanted resonant response that may go as far as to destroy the gradient coil system.

A large proportion of the components cited above in the monitoring module may be realized completely or partially in the form of software modules in a processor of an appropriate controller. This is advantageous inasmuch as, by the installation of software, for the purpose of carrying out the method, controllers that are already present may be upgraded. A computer program product that may be loaded directly into a processor of a programmable controller of a medical technology imaging system (e.g., of a magnetic resonance tomography system), with program code for carrying out the method when the program is executed in the controller is provided. With the computer program product, the acts of the method may be executed when the computer program product is loaded into a memory of a programmable device.

Alternatively, the execution of the electrical resonant circuit model or the monitoring module, as applicable, may be implemented as a freely programmable logic circuit (e.g., a field-programmable gate array (FPGA)). This enables particularly rapid signal processing.

The description in one category may also be developed in analogous ways as in another category.

The nature and manner of the way, in which the mechanical resonance response of the coil are recorded, is not restricted to particular options. It is advantageous if a central frequency and quality are determined for a resonant circuit. As already explained above, the mechanical resonance response of the coil system may have several points of resonance. In this case, the central frequency and the quality may be determined for each point of resonance. For example, by taking into account the quality of the resonant circuit, a judgment as to whether a frequency component that lies somewhat to one side of the resonant frequency is still able to evoke a resonant response, or not may be made. The quality is a statement as to the width of the resonance and is calculated from the resonant frequency divided by the bandwidth for a decline of 3 dB compared to the amplitude of the resonance.

The mechanical resonance response may be modeled not exactly using the electrical resonant circuit model, but instead, for example, a central frequency that is somewhat greater than the measured mechanical resonance frequency may be assigned to the resonant circuit model. This is advantageous, for example, if the coil is a gradient coil, because it is thereby possible to achieve a better coverage of different tolerance states that may arise due to changes in the gradient coil mounting.

It may also be advantageous, depending on the mechanical resonance response that is measured, to represent two resonant frequencies that lie close to each other by one resonant circuit model, the central frequency of which lies between the two measured points of resonance.

It is advantageous if the electrical resonant circuit model is based on a digital infinite impulse response (IIR) bandpass filter. The creation of digital IIR bandpass filters is well understood, and rapid signal processing may be provided. A prerequisite for digital filters is discrete numeric values as the input signals. Each individual numeric value undergoes digital processing. The numeric values are realized using logic modules or in the form of a software program.

In one embodiment, an analog bandpass filter is designed to model the mechanical resonance response, and from this analog bandpass filter, a digital IIR bandpass filter is produced using a bilinear transformation.

Unlike a digital filter, an analog filter is realized using electrical components such as resistors, inductors and capacitors. An analog band filter is defined using the measured values of the central frequency and the quality.

The way in which the transfer function (e.g., the dependence of the amplification of an analog bandpass on the frequency) is specified in the Laplace domain is well known. The transfer function then reads:

$$A(p) = \frac{(A_r \div Q) \cdot p}{1 + (1 \div Q) \cdot p + p^2}$$

where $A_r$ is the amplification at the point of resonance, and Q is the quality. A(p) is the amplification at p, where p is a complex frequency. The equation may be normalized (e.g., by setting $A_r=1$).

After the application of a bilinear transformation, a digital transfer function is obtained from this.

$$A(z) = \frac{D0 + D2 \cdot z^2}{C0 + C1 \cdot z + C2 \cdot z^2}$$

where z is derived from p using $z=e^{pT}$, with T being the duration of the sampling periods, as is familiar from the Z-transformation.

For the conversion of the coefficients, the following applies:

$$D0 = \frac{-d1 \cdot l}{c0 + c1 \cdot l + c2 \cdot l^2}$$

$$D2 = \frac{d1 \cdot l}{c0 + c1 \cdot l + c2 \cdot l^2}$$

$$C0 = \frac{c0 - c1 \cdot l + c2 \cdot l^2}{c0 + c1 \cdot l + c2 \cdot l^2}$$

$$C1 = \frac{2 \cdot (c0 - c2 \cdot l^2)}{c0 + c1 \cdot l + c2 \cdot l^2}$$

$$C2 = 1$$

with $l = \cot\left(\frac{\Pi}{\Omega a}\right)$, where $$\Omega a = \frac{fa}{fkrit}$$

is the sampling frequency, fa is the sampling frequency, and fkrit is the resonance frequency.

The following applies for the coefficients $$d1 = \frac{1}{Q}$$

$$c0 = 1$$

$$c1 = \frac{1}{Q}$$

$$c2 = 1.$$

The general analog transfer function for a bandpass then becomes $$A(p) = \frac{d1 \cdot p}{c0 + c1 \cdot p + c2 \cdot p^2}$$

This gives the following differential equations for the digital model of a mechanical oscillator:

$z1(k)=D2 \cdot x(k)-C1 \cdot z1(k-1)-C0 \cdot z2(k-1)$ and $z2(k)=z1(k-1)$ with the state buffers z1 and z2 and $y(k)=b1 \cdot z1(k)+b2 \cdot z1(k-1)+b3 \cdot z2(k-1)$ with $b1=1$, $b2=0$ and $b3=D0/D2$.

k is a sequential sample index that runs from 0 to ∞.

In one embodiment, a digital filter may be calculated from an analog bandpass filter using a bilinear transformation.

In one embodiment, the inductor is a gradient coil in a magnetic resonance tomography system, through which a particular gradient pulse sequence is sent.

In magnetic resonance tomography systems, for example, the danger of damage from resonance in a coil is especially high, because very strong magnetic fields are in effect.

In one embodiment, the check for resonances is carried out before an investigatory procedure is started. A newly created gradient pulse sequence that is tailored to a particular investigation situation, initially offline for a resonance response (e.g., independently of any direct investigation situation), may be checked out.

In another embodiment, the act to check for resonances is carried out in parallel with a digital-to-analog conversion of the signal for the current. In a magnetic resonance tomography system, the controller provides a current set value in digital form. This undergoes a digital-to-analog conversion, is amplified and is then fed into the coil. The check for resonance is advantageously carried out at the same time as the digital-to-analog conversion, so that there is no loss of time. If this establishes that the chosen gradient pulse sequence would lead to damaging resonances, then the feeding of the current into the gradient coils is suppressed.

In another embodiment, the act to check for resonances is carried out after the digital-to-analog conversion of the signal for the current. In this way, changes in the current that may only be attributed to the digital-to-analog conversion or to the subsequent amplification are also detected. Hence, the actual value is checked. For this purpose, the analog actual current value is measured. The analog actual current value may be directly sampled (e.g., digitized). In one embodiment, digitization does not take place until in the monitoring module.

In one development, the blocking of the current flow is carried out by the actuation of an amplifier. By this, the emission may be suppressed without the need for an additional switch.

In one development, a threshold value is defined for an output signal from the digital resonant circuit model, such that when the threshold value is exceeded, the current flow is blocked. A continuous monitoring of this output signal then permits a statement to be made as to whether resonant responses that endanger the system are present.

The output signal from the digital resonant circuit model may not be compared with the threshold value until after a defined transient settling time. This transient settling time may be, for example, the resonant circuit quality factor/3. The background to this is that transient initial responses with overshoots may occur when an oscillation sets in. These overshoots may be greater than the threshold value, but the overshoots only last a short time, so that, in the case of mechanical resonances, no damage will yet have occurred to the system. After the transient response time, a constant maximum amplitude of oscillation is reached, and the constant maximum amplitude of oscillation may not exceed the threshold value. In one embodiment, two threshold values are set (e.g., one threshold that the overshoots may not exceed, and one threshold for the state after settling).

In one development, the absolute value of the output signal from the digital resonant circuit model is formed, or the individual discrete signal values are squared, before the comparison with the threshold value. This signal processing reduces the overshoot characteristics. As an alternative to this or in a further form of embodiment, as applicable, the output signal from the digital resonant circuit model may also be passed through a moving average filter before the output signal is compared with the threshold value. This again avoids overshoots.

BRIEF DESCRIPTION OF THE DRAWINGS

Components that are the same in the various figures have been given identical reference marks.

DETAILED DESCRIPTION

Figure 1:
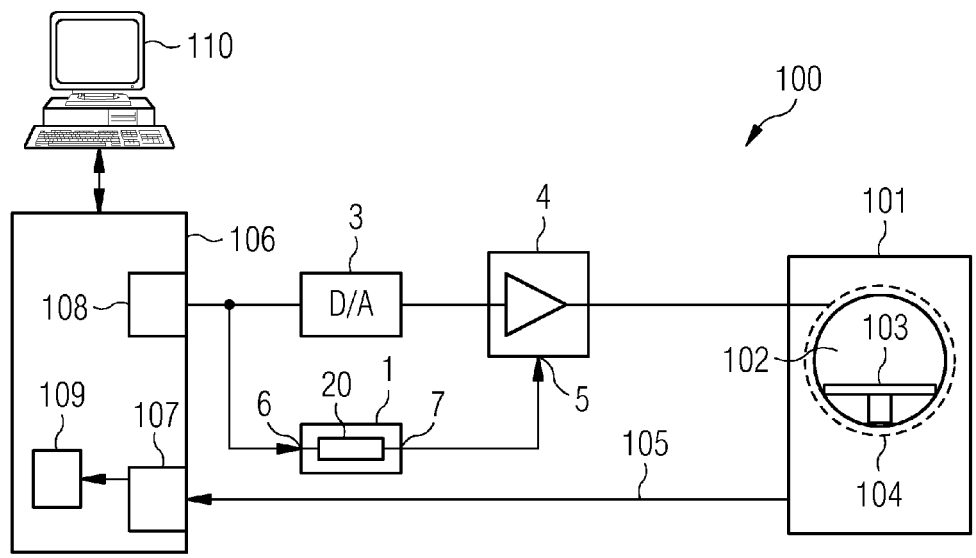
FIG. 1 shows a schematic block diagram of one embodiment of a magnetic resonance tomography system, in which use is made of a monitoring module.

FIG. 1 shows a schematic block diagram of one embodiment of a magnetic resonance tomography system 100. A monitoring module 1 is used in the magnetic resonance tomography system 100. Even though the following description refers to a magnetic resonance tomography system, the invention is not restricted to this application situation.

A central part of the magnetic resonance tomography system 100 is a normal scanner 101, in which a patient or experimentee (not shown) may be positioned for an investigation on a table 103 in a measurement space 102 (e.g., a "patient tunnel"). This representation is to be understood as not restrictive. The method and the monitoring module may be used in magnetic resonance tomography systems of the open type, in which the investigation space is of a more open construction.

The scanner 101 has a basic magnetic field system for the purpose of applying, to the measurement space 102, a basic magnetic field together with a gradient coil system 104, through which a pulse sequence of magnetic field gradient pulses, a gradient pulse sequence, may be emitted in accordance with a predefined measurement protocol. Appropriate corresponding high frequency pulses may be emitted through an arrangement of high-frequency antennas that is not shown, for the purpose of exciting nuclear spins in a region that is to be investigated in the object under investigation. The arrangement of high-frequency antennas may also pick up the magnetic resonance signals that arise from the relaxation of the excited nuclear spin. Different arrangements of high-frequency antennas are utilized for an investigation (e.g., a body coil for emitting the high-frequency pulses and local coils for picking up the magnetic resonance signals).

The scanner 101 is actuated by a controller 106 of the magnetic resonance tomography system 100. The controller 106 has various interfaces. The interfaces includes, for example, a gradient transmission interface 108, through which a desired gradient pulse sequence is fed into the arrangement of gradient antennas 104.

The controller 106 has a magnetic resonance signal receiving interface 107 that takes the magnetic resonance signals in as raw data from the arrangement of high-frequency antennas used for receiving the magnetic resonance signals, through a link 105, processes the magnetic resonance signals and passes the magnetic resonance signals to a reconstruction unit 109 that reconstructs the image data in the usual way on the basis of the raw data. Connected to the controller 106 is a terminal 110, through which an operator may operate the controller 106, and hence the entire magnetic resonance tomography system 100.

Other components of the scanner 101 (e.g., the high-frequency antenna coil system, the basic field magnet system, the table 103) may be actuated by the controller 106 via further interfaces. However, all these components are known to the person skilled in the art, and hence are not shown in more detail in FIG. 1. The magnetic resonance tomography system may have a host of further components such as, for example, interfaces to particular networks that are familiar to the specialist and need no further explanation.

FIG. 1 also shows a digital-to-analog converter 3 that is connected to the gradient transmission interface 108. An output from the digital-to-analog converter 3 is connected to an amplifier module 4. An output from the amplifier module 4 is connected to the gradient coil 104. The monitoring module 1 is connected, by an input 6, to the input on the digital-to-analog converter 3 or to the gradient transmission interface 108, as appropriate. The monitoring module 1 thus receives, at the input 6, the set value of the gradient current, a gradient pulse sequence in digital form. An output 7 from the monitoring module 1 is connected to the amplifier module 4 at a control input 5. At the control input 5, the amplifier module 4 receives the output signal from the monitoring module (e.g., a stop signal). The monitoring module 1 incorporates an electrical resonant circuit model 20. The illustration in FIG. 1 is not to be regarded as restrictive. For example, FIG. 1 illustrates nothing about the spatial arrangement of the individual components. For example, the monitoring module 1 may also be an integral element in the controller 106.

A user (e.g., a doctor or other clinician and scientists in a higher education environment) designs a gradient pulse sequence that is tailored for a particular imaging task. The gradient pulse sequence is input into the controller 106 of the magnetic resonance tomography system 100 through the terminal 110 and after further processing, is passed on to the gradient transmission interface 108. In echo planar imaging, cited only by way of example, the gradient pulse sequence may include a series of bipolar gradient pulses (e.g., a gradient ramp is increased from zero up to a maximum positive value and then immediately in the opposite direction to the negative maximum value). A series of triangular pulses of a bipolar nature results. Each gradient pulse generates a gradient echo. Because of the rapid T2 decay of free induction decay (FID) or MR signal, the gradient pulses are to follow one another in rapid succession in order to be able to generate several echoes within this time interval. Ramp duration times of 200 to 300 µs are common values.

At the gradient transmission interface 108, the planned gradient pulse sequence (e.g., the profile of the current that is to flow through the gradient coil or gradient coils, as applicable) is transmitted to the digital-to-analog converter 3 in digital form. In parallel with this, the digital signal is applied at the input 6 of the monitoring module 1. In the monitoring module 1, the signal passes through the electronic or the digital resonant circuit model 20, as applicable. Within the monitoring module 1, the output signal from the resonant circuit model is investigated to see if there is a resonant response that would be disruptive to the system. Specifically, the amplitudes of the output signal from the resonant circuit model are compared with a predefined threshold value. If the amplitude of the output signal, or the envelope of the output signal, as applicable, lies above the predefined threshold value (e.g., if there is a resonant oscillation), then a stop signal is triggered. The stop signal is fed through the output 7 to the amplifier module 4 and results in the amplifier being switched off. The current flow to the gradient coil 104 is thus suppressed. The resonant circuit model 20 models the mechanical resonance response of the gradient coils that are to be fed. The resonant circuit model 20 may be programmed as a digital filter in a digital signal processor DSP. The programming, in any programming language, is, for example, possible on any arbitrary processor. The digital filter may be implemented as a freely-programmable logic circuit (FPGA).

Figure 2:
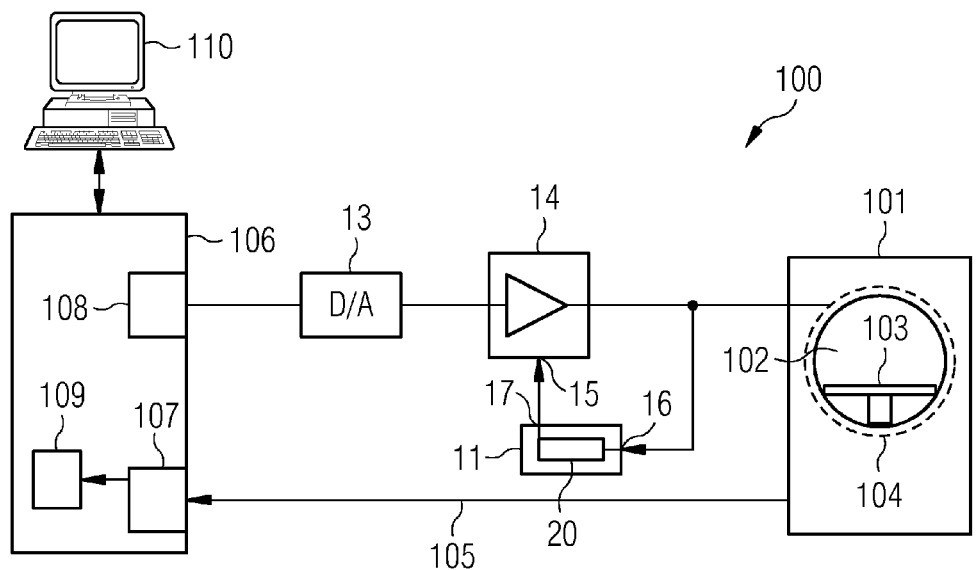
FIG. 2 shows a schematic block diagram of one embodiment of a magnetic resonance tomography system, in which use is made of an alternative arrangement of a monitoring module.

FIG. 2 shows one embodiment of a magnetic resonance tomography system 100. The standard components are the same as those shown in FIG. 1, and are not explained further here. The magnetic resonance tomography system 100 shown in FIG. 2 incorporates a digital-to-analog converter 13, an amplifier unit 14 and a monitoring module 11. The monitoring module 11 incorporates an electrical resonant circuit model 20.

The digital-to-analog converter 13 is connected to the gradient transmission interface 108. The analog output from the digital-to-analog converter 13 is connected to an input into the amplifier module 14. The output from the amplifier module 14 is connected to the gradient coil or gradient coil system 104, as applicable. A difference from FIG. 1 is that in FIG. 2 the monitoring module 11 is connected by an input 16 to the output from the amplifier module 14. An output 17 from the monitoring module is connected to a control input 15 on the amplifier module 14.

In the arrangement shown in FIG. 2, the actual value of the current signal is monitored. In order to be able to tap off the signal, as shown in FIG. 2, after the amplifier module 14, a measurement device is to be provided. Since the current signal in this case is analog, the resonant circuit model 20 may be constructed in analog form.

In one embodiment, an analog-to-digital conversion of the actual value is effected in the monitoring module or, not shown here, in a separate analog-to-digital converter. Current measurement devices, by which the current that is to be measured is sampled (e.g., an analog-to-digital conversion takes place), are also common. The same digital resonant circuit model may be used as in FIG. 1. At the output 17 from the monitoring module 11, a stop signal is output if the result of the check is that the output signal from the resonant circuit model exceeds defined limit values.

Figure 3:
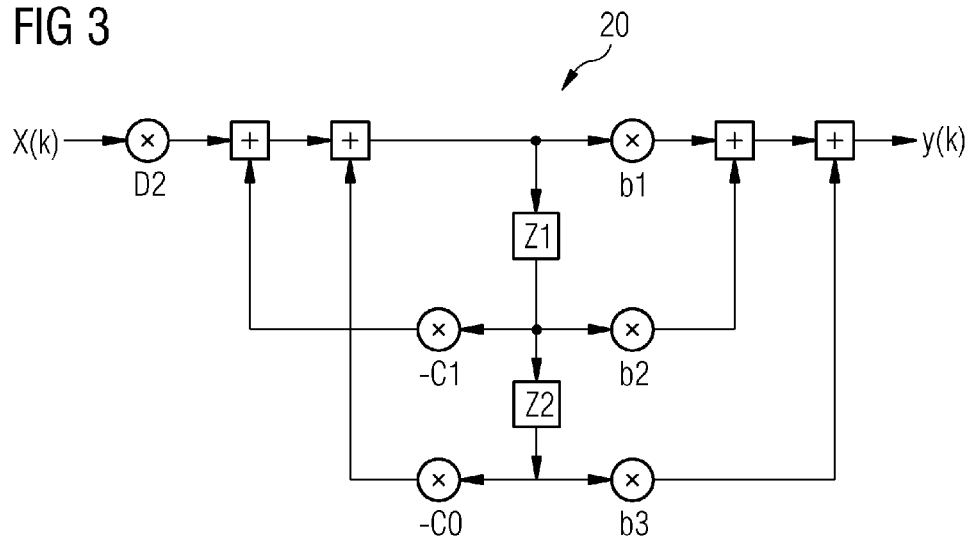
FIG. 3 shows an exemplary model of a digital filter.

The way in which the resonant circuit model 20 functions is explained in more detail below referring to FIG. 3. FIG. 3 shows a representation of a digital IIR bandpass filter, such as is used, for example, in the software calculation program MATLAB. An IIR filter is a recursive filter. The representation in FIG. 3 is explained insofar as is necessary for an understanding of the embodiment. The representation is known to a person skilled in the art involving digital filters. The equations for $z1(k)$ and $z2(k)$, which have already been explained above, may be deduced directly from the structural block diagram shown in FIG. 3:

$$z1(k)=D2 \cdot x(k)-C1 \cdot z1(k-1)-C0 \cdot z2(k-1) \text{ and}$$

$$z2(k)=z1(k-1)$$

The input signal $x(k)$, which corresponds to the current that is desired to feed in, is input into the model on the left. On the right, the output signal $y(k)$ that will be checked for the presence of resonances is output. k identifies the sampling. The relationship $k \cdot t_A = t$ applies. Here, $t_A$ is the sampling interval. k is a sequential index and runs from 0 to ∞.

The output signal $y(k)$ is a digital signal. Each value $y(k)$, for k from 0 to ∞, is in each case a discrete signal value. In order to avoid overshoot problems, each of the values $y(k)$ may be squared, or the absolute value of $y(k)$ may be used.

The model shown in FIG. 3 is produced after a bilinear transformation from an analog filter that has previously been produced. For this purpose, the first act is to measure the mechanical resonance response of the gradient coil or the gradient coil system. This may be done, for example, by known measurement methods such as the use of oscillation recorders. In one embodiment, the noise that arises may be measured. In another embodiment, the resonance responses of the mechanical system are simulated. In the case of a magnetic resonance tomography system, the helium evaporation rate may also be determined. From the measured values thus obtained, the central frequency and quality are determined for the resonance points detected. From these, an analog bandpass filter, from which a digital filter may be realized using a bilinear transformation, may be define in the known way.

Figure 4:
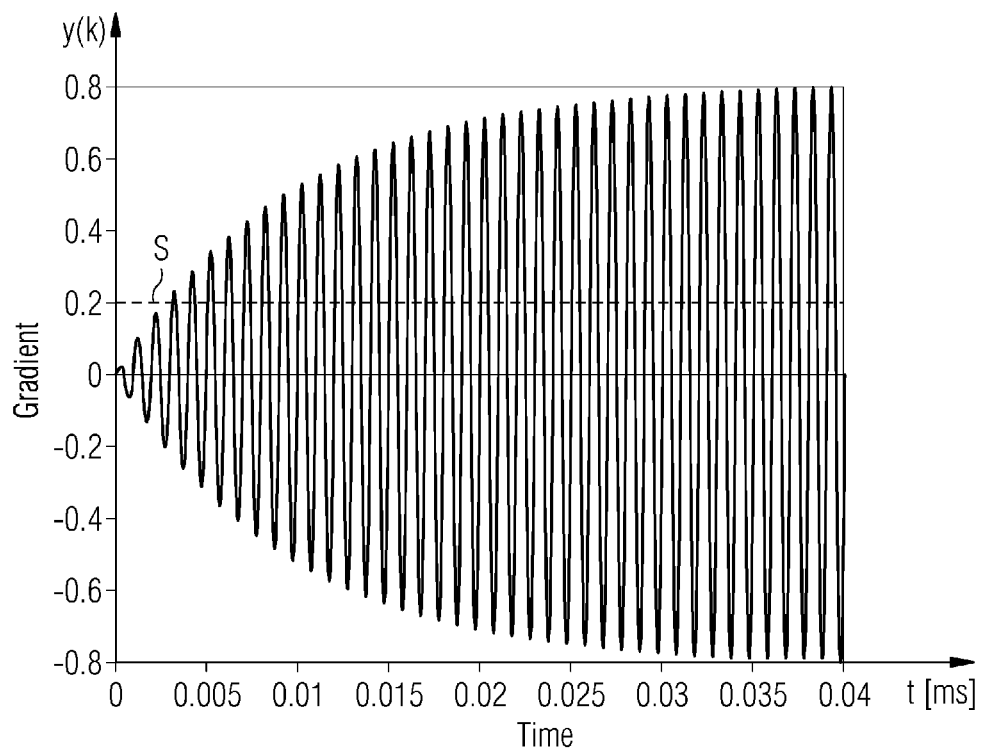
FIG. 4 shows an exemplary output signal from a digital filter in the case of an input signal with a first excitation frequency.
Figure 5:
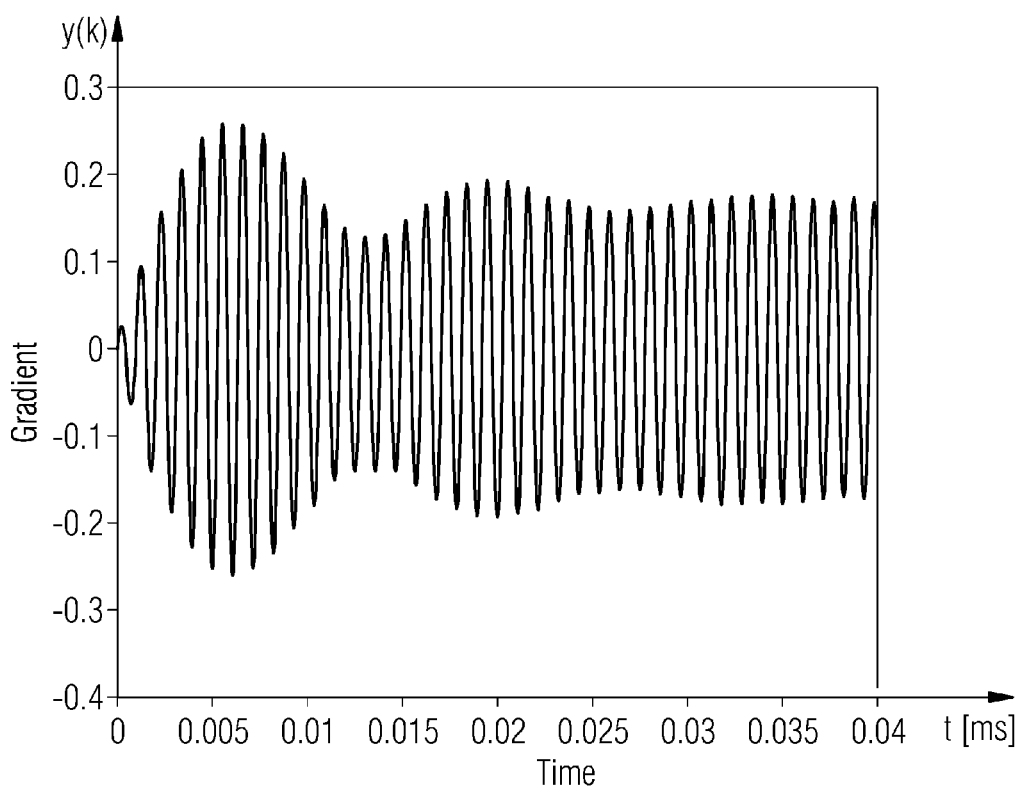
FIG. 5 shows an exemplary output signal from a digital filter in the case of an input signal with a second excitation frequency.

FIGS. 4 and 5 show graphs of the results for the output signal y(k) against time t. The electric resonant circuit model is, for example, designed for a resonant frequency of 1000 Hz because the measurement of the mechanical resonance response for the coil concerned has produced this value. As the quality of the resonant circuit, Q=30 has been assumed.

In FIG. 4, the gradient (e.g., the output signal y(k)) is plotted on the y-axis in arbitrary units. The x-axis represents a time axis t in units of milliseconds. The link between k, the sequential index, and the time t is through the sampling rate. In the present example, a sampling frequency of 100 kHz has been assumed. This corresponds to a sampling interval of 1/fa=10 μs. As the excitation signal or input signal x(k), as applicable (e.g., as the gradient pulse sequence), a continuous bipolar gradient ramp with a ramp time of 250 μs has been chosen. The continuous bipolar gradient ramp corresponds to a signal frequency of 1000 Hz. As expected, the result shows a marked resonant response. The amplitudes of the output signal increase over time. This gradient pulse sequence may not be passed on to the gradient coil system, because the gradient pulse sequence would lead to strong mechanical oscillations.

Indicated by way of example in FIG. 4 is a threshold value S such that a stop signal is output if the threshold value S is exceeded. Depending on the system, this may lie at 0.2 or 0.4, for example. In the case of a threshold value of S=0.2 then, as shown in FIG. 4, a termination signal or stop signal, as applicable, would be issued after a time of about 0.005 ms.

FIG. 5 shows a graph, in which y(k) is plotted in arbitrary units against time in units of milliseconds. The mechanical resonance system, which is, for example, modulated by a digital resonant circuit model, again has a resonant frequency of 1000 Hz and a quality of Q=30. As the input signal (e.g., as the gradient pulse sequence), continuous bipolar gradient ramps have once again been chosen, but with a ramp time of 270 μs. This corresponds to a signal frequency of 932 Hz. Thus, the ramp time has been lengthened compared to the first example. In the tomographic application, this provides that less gradient echoes may be produced, so that the precision of the imaging is degraded. FIG. 5 shows that the resonant situation is no longer reached. Although the mechanical system that is modeled by the digital model does begin to oscillate, it does, however, remain in a range below 0.2 after about 0.04 ms. Overshoots do arise in the initial phase. Thus, after about 0.005 ms, an amplitude of about 0.26 is reached. If a rigid threshold value of 0.2 is defined, for example, then after about 0.004 ms, there would be a stop signal. Looking at the subsequent course of the signal, this does not seem justified.

This problem may be avoided by incorporating a settling time into the calculations, and making the comparison against the threshold value only after a time of, for example, 0.02 ms or 0.03 ms. The brief higher amplitude oscillation may be tolerated by most mechanical systems. The precise limits, at which a stop signal may be generated in order to stop the current feed, are laid down for each system individually.

The use of a monitoring module in accordance with one embodiment makes it possible to effect a termination in real time, and thus reliably prevent damage to the system. The system may not be manipulated or circumvented. This is more easily possible with forbidden frequency bands. The monitoring module with the electrical resonant circuit model automatically takes into account the amplitude of the excitation, and/or whether frequencies in the vicinity of a point of resonance will, because of their amplitude, be sufficient to trigger a resonance. Additionally or alternatively, the monitoring module with the electrical resonant circuit model automatically takes into account whether a signal will trigger no resonant oscillations, because the amplitude is too low, even though the signal is at exactly the resonant frequency. Frequency bands that would otherwise permit good image qualities do not need to be unnecessarily forbidden.

The monitoring modules described in detail above are solely exemplary embodiments that a person skilled in the art could modify in the most diverse ways without departing from the ambit of the invention. The use of the indefinite article "a" does not exclude the possibility that the features concerned are also present in greater numbers. The terms "unit" and "module" do not exclude the possibility that the components concerned include several interoperating subcomponents that may, if necessary, also be spatially distributed.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for operating a coil, through which a varying current flows, the method comprising:
   recording a mechanical resonance response of the coil;
   modeling the mechanical resonance response using an electrical resonant circuit model;
   checking whether the varying current, which is to be transmitted through the coil, evokes a resonant response in the electrical resonant circuit model; and
   blocking a current flow through the coil when the resonant response exceeds a predefined limit value.

2. The method as claimed in claim 1, wherein a central frequency and a quality of a resonant circuit are defined for the mechanical resonance response.

3. The method as claimed in claim 1, wherein a digital IIR bandpass filter is used as the basis for the electrical resonant circuit model.

4. The method as claimed in claim 1, further comprising:
   designing an analog bandpass filter to model the mechanical resonance response; and
   producing a digital IIR bandpass filter from the analog bandpass filter using a bilinear transformation.

5. The method as claimed in claim 1, wherein the coil comprises a gradient coil of a magnetic resonance tomography system, through which a defined gradient pulse sequence is transmitted.

6. The method as claimed in claim 5, wherein the checking is carried out after a gradient pulse sequence is created and before an investigatory procedure is started.

7. The method as claimed in claim 5, wherein the checking is carried out in parallel with a digital-to-analog conversion of a current signal.

8. The method as claimed in claim 5, wherein the checking is carried out after a digital-to-analog conversion of a current signal, the checking comprising measuring a current after the digital-to-analog conversion.

9. The method as claimed in claim 1, wherein the blocking is effected by actuation of an amplifier.

10. The method as claimed in claim 1, further comprising defining the limit value for an output signal from the electrical resonant circuit model such that when the defined threshold value is reached or exceeded, the current flow is blocked.

11. The method as claimed in claim 10, wherein the output signal from the electrical resonant circuit model is not compared with the predefined limit value until after a defined transient settling time.

12. The method as claimed in claim 10, wherein the absolute value of the output signal from the electrical resonant circuit model is formed, or individual discrete signal values are squared, before a comparison with the predefined limit value.

13. A monitoring module comprising:
an electrical resonant circuit model operable to model a mechanical resonant response of a coil, through which a varying current flows;
an input operable to receive an actual value or a set value for the varying current; and
an output operable to output a stop signal, by which feeding of current into the coil is blocked,
wherein the varying current, which is received, is fed through the electrical resonant circuit model, and the stop signal is output when the current in the electrical resonant circuit model evokes a resonant response that exceeds a predefined limit value.

14. A magnetic resonance tomography system comprising:
a monitoring module comprising:
an electrical resonant circuit model operable to model a mechanical resonant response of a coil, through which a varying current flows;
an input operable to receive an actual value or a set value for the varying current; and
an output operable to output a stop signal, by which feeding of current into the coil is blocked,
wherein the varying current, which is received, is fed through the electrical resonant circuit model, and the stop signal is output when the current in the electrical resonant circuit model evokes a resonant response that exceeds a predefined limit value.

15. A non-transitory computer program product loadable directly into a memory of a programmable controller of a medical technology imaging system, the computer program product comprising program code executable by the programmable controller to:
record a mechanical resonance response of a coil;
model the mechanical resonance response using an electrical resonant circuit model;
check whether the varying current, which is to be transmitted through the coil, evokes a resonant response in the electrical resonant circuit model; and
block a current flow through the coil when the resonant response exceeds a predefined limit value.

16. The non-transitory computer program product as claimed in claim 15, wherein the programmable controller comprises the monitoring module.

17. The method as claimed in claim 2, wherein a digital IIR bandpass filter is used as the basis for the electrical resonant circuit model.

18. The method as claimed in claim 17, further comprising:
designing an analog bandpass filter to model the mechanical resonance response; and
producing a digital IIR bandpass filter from the analog bandpass filter using a bilinear transformation.

19. The method as claimed in claim 18, wherein the coil comprises a gradient coil of a magnetic resonance tomography system, through which a defined gradient pulse sequence is transmitted.

20. The method as claimed in claim 19, wherein the checking is carried out after a gradient pulse sequence is created and before an investigatory procedure is started.

* * * * *